United States Patent
Takayanagi

(10) Patent No.: US 7,910,970 B2
(45) Date of Patent: Mar. 22, 2011

(54) PROGRAMMABLE ELEMENT AND MANUFACTURING METHOD OF SEMICONDUCTOR DEVICE

(75) Inventor: Mariko Takayanagi, Tuckahoe, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/143,019

(22) Filed: Jun. 20, 2008

(65) Prior Publication Data

US 2009/0078987 A1    Mar. 26, 2009

(30) Foreign Application Priority Data

Jun. 20, 2007    (JP) .................. 2007-162401

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl. ........... 257/296; 257/E21.17; 257/E21.218; 257/E21.229; 257/E21.278; 257/E21.293; 257/E21.304; 257/E21.545; 257/E21.561; 257/E21.645; 257/E21.646; 257/312; 257/347

(58) Field of Classification Search .................... 257/68, 257/269, 312, 347, 387, 391, 410, 507, 288, 257/701, 760, E21.17, 229, 218, 304, 278, 257/293, 54, 561, 645, 646
See application file for complete search history.

(56) References Cited

U.S. PATENT DOCUMENTS

| | | | | |
|---|---|---|---|---|
| 4,774,421 A | * | 9/1988 | Hartmann et al. | 365/185.17 |
| 7,265,421 B2 | * | 9/2007 | Madurawe | 257/348 |
| 7,279,740 B2 | * | 10/2007 | Bhattacharyya et al. | 257/324 |
| 7,595,204 B2 | * | 9/2009 | Price | 438/14 |
| 7,611,979 B2 | * | 11/2009 | Callegari et al. | 438/588 |

FOREIGN PATENT DOCUMENTS

JP    2003-115537    4/2003

* cited by examiner

*Primary Examiner* — David Nhu
(74) *Attorney, Agent, or Firm* — Turocy & Watson, LLP

(57) ABSTRACT

In one aspect of the present invention, a programmable element, may include a semiconductor substrate, source/drain layers formed apart from each other in the upper surface of the semiconductor substrate, a gate insulating film including a charge-trapping film containing Hf and formed on a portion between the source/drain layers of the semiconductor substrate, and a gate electrode formed on the gate insulating film with a program voltage applied to the gate electrode.

16 Claims, 7 Drawing Sheets

PROGRAMMABLE ELEMENT AND MANUFACTURING METHOD OF SEMICONDUCTOR DEVICE

CROSS REFERENCE TO RELATED APPLICATION

This application is based upon and claims the benefit of priority from Japanese Patent Application No. 2007-162401, filed on Jun. 20, 2007, the entire contents of which are incorporated herein by reference.

BACKGROUND

1. Field of the Invention

The present invention relates to a programmable element and a manufacturing method of a semiconductor device including the programmable element, particularly to a programmable element used in a programmable logic device such as a field programmable gate array (hereinafter, referred to as FPGA) and a manufacturing method of a semiconductor device including the programmable element.

2. Description of the Related Art

A programmable logic device such as an FPGA is a semiconductor device including multiple logic circuitries and programmable elements formed on interconnections between the multiple logic circuitries. The programmable logic device exerts a predetermined function with predetermined ones of the multiple logic circuitries connected to or disconnected from each other through an appropriate control of the programmable elements.

In a conventional programmable logic device, antifuses, erasable programmable read-only memories (EPROMs), electrically erasable programmable read-only memories (EEPROMs) or static random access memories (SRAMs) are employed as the programmable elements with which desired logic circuitries are made connected to or disconnected from one another.

However, a semiconductor device including antifuses as programmable elements (refer to Japanese Patent Application Publication No. 2003-115537 (FIG. 3)) has a problem that a program therein cannot be rewritten. Meanwhile, a semiconductor device including EPROMs or EEPROMs as programmable elements has a problem that withstand voltages of elements and the like in the semiconductor device need to be increased, since these programmable elements require a high program voltage, that is, a high voltage needs to be applied to these programmable elements when the semiconductor device is programmed. Moreover, a semiconductor device including SRAMs as programmable elements has a problem that a program written therein is erased once the semiconductor device is powered off.

Thus, it is currently difficult to provide such a program element with good program characteristics that: a program can be re-written; the program voltage is low; and the program is retained after powering-off.

SUMMARY

Aspects of the invention relate to an improved semiconductor device.

In one aspect of the present invention, a programmable element, may include a semiconductor substrate, source/drain layers formed apart from each other in the upper surface of the semiconductor substrate, a gate insulating film including a charge-trapping film containing Hf and formed on a portion between the source/drain layers of the semiconductor substrate, and a gate electrode formed on the gate insulating film with a program voltage applied to the gate electrode.

In another aspect of the invention, a manufacturing method of a semiconductor device including a programmable element, a logic circuit element, a programmable element formation region and a logic circuit element formation region divided by element isolations may include forming an insulating film containing Hf on the programmable element formation region and the logic circuit element formation region, depositing a gate-electrode material on the insulating film, selectively etching the gate-electrode material and the insulating film to leave a stacking structure of the gate insulating film and a gate electrode on each region of the programmable element formation region and the logic circuit element formation region, and forming source/drain layers in respective portions, adjacent to the stacking structures each consisting of the gate insulating film and the gate electrode, of the programmable element formation region and the logic circuit element formation region, by the implanting of impurity ions into the portions, and thereby forming the programmable element and a logic circuit element on the programmable element formation region and the logic circuit element formation region, respectively.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIG. 4A shows an amount of threshold voltage change with the change of thickness of a gate insulating film, while FIG. 4B shows an amount of threshold voltage change with the change of thickness of an interlayer.

DETAILED DESCRIPTION

Figure 1:
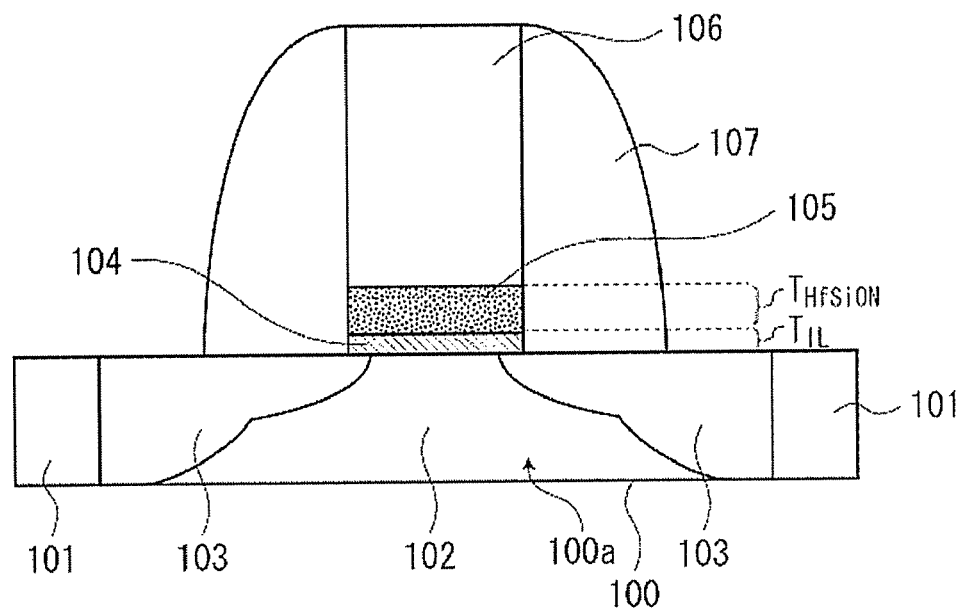
FIG. 1 is a cross-sectional view showing a configuration of a programmable element according to an embodiment of the present invention.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

First Embodiment

Hereinafter, with reference to drawings, description will be given of a semiconductor device according to an embodiment of the present invention, and the manufacturing method thereof.

Firstly, with reference to FIG. 1, description will be given of a configuration of a programmable element according to this embodiment. FIG. 1 is a cross-sectional view showing the configuration of the programmable element according to the embodiment of the present invention.

As shown in FIG. 1, the programmable element according to this embodiment is an n-MOSFET in which a well region 102 and source/drain layers 103 are formed in the upper surface of a programmable element formation region 100a defined by element isolations 101 in the upper surface of the semiconductor substrate 100 formed of a single-crystal silicon or the like. In order to form the well region 102, p-type impurity ions, such as boron or indium ions, for example, are implanted in the upper surface of the programmable element formation region 100a. Meanwhile, in the source/drain layers 103, n-type impurity ions, such as phosphorus or arsenic ions, are implanted, for example. The source/drain layers 103 are spaced apart from each other.

On a channel region between the source/drain layers 103 formed in the upper surface of the programmable element formation region 100a of the semiconductor substrate 100, an interlayer 104 which is a thin silicone oxide film or the like is formed. In addition, a gate insulating film 105 is formed on the interlayer 104. In this embodiment, the gate insulating film 105 is an insulating layer containing Hf (HfSiON film) to function as a charge-trapping film.

On the gate insulating film 105 (charge-trapping film), formed is a gate electrode 106 made of a material such as a polysilicon doped with impurity ions, or a metal, for example. The metal used here may be nickel, tungsten or the like. On the gate electrode 106, a lead line for supplying a program voltage is formed, and an interconnection (not shown) and the like, are formed on the gate electrode 106 with a contact plug interposed therebetween, for example. In addition, on the semiconductor substrate 100, gate-sidewall insulating films 107 are formed in contact with the both side surfaces of the gate electrode 106 and the gate insulating film 105. Here, each gate-sidewall insulating film 107 is a silicone oxide film, a silicon nitride film or the like.

Figure 2:
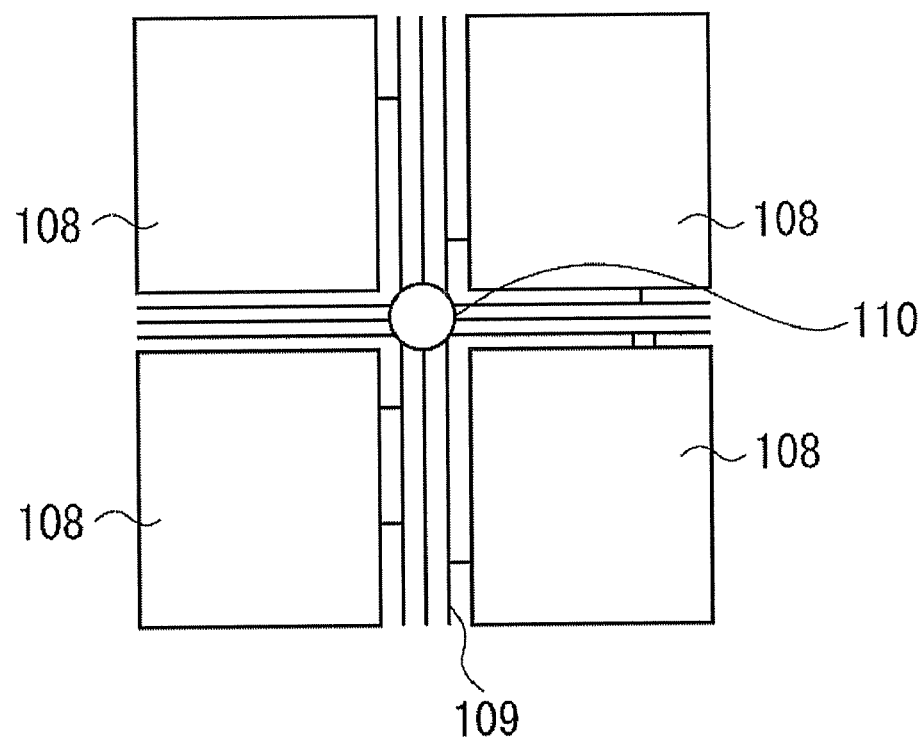
FIG. 2 is a plan view showing a configuration of a semiconductor device including the programmable elements according to the embodiment of the present invention.

Next, with reference to FIG. 2, description will be given of a configuration of an FPGA that is a semiconductor device including the programmable elements according to this embodiment. FIG. 2 is a plan view of the semiconductor device including the programmable elements according to this embodiment.

In the semiconductor device according to this embodiment, logic circuitries 108 are disposed in a grid pattern on the semiconductor substrate 100. Each logic circuitry 108 consists of multiple logic circuit elements and the like, and interconnections 109 made of a metal such as copper are connected to input/output parts of the logic circuitries 108. The interconnections 109 are formed extending along regions between the logic circuitries 108, which are disposed in a grid pattern.

On each intersection of the interconnections 109 extending along the regions between the logic circuitries 108, a programmable element 110 is formed. The interconnections 109 are connected to the source/drain layers 103 of the programmable elements 110 with contact plugs (not shown) interposed therebetween. Each of the interconnections 109 connected to the source/drain layers 103 establishes an electrical connection through the corresponding programmable element 110, when this programmable element 110 is switched on. On the other hand, each interconnection 109 establishes no electrical connection when the corresponding programmable element 110 is switched off. Thus, in the semiconductor device according to this embodiment, predetermined two or more logic circuitries 108 are electrically connected to one another through the interconnections 109, when one or more programmable elements 110 disposed on the interconnections 109 between the logic circuitries 108 are switched on. On the other hand, the predetermined logic circuitries 108 are electrically disconnected from one another, when these programmable elements 110 are switched off.

Accordingly, by selectively programming on/off conditions of the programmable elements 110 formed on the interconnections 109 between predetermined logic circuitries 108 in the semiconductor device according to this embodiment, it is possible to make the predetermined logic circuitries 108 connected or disconnected to/from one another, and thereby to cause the semiconductor device to provide a predetermined function.

Next, description will be given of a method for programming the programmable elements according to this embodiment.

In the programmable element according to this embodiment, a threshold voltage of the channel region is changed to program an on/off condition of the programmable element. Specifically, when a program voltage is applied to the gate electrode 106 of each predetermined element, that is, when bias is applied between the gate electrode 106 and the semiconductor substrate 100 of each predetermined element, some charges in the channel region of the programmable element are trapped in the gate insulating film 105, and, as a result, the threshold voltage of the channel region is changed. As described above, the present invention makes it possible to control the on/off condition of predetermined programmable elements in a semiconductor device during its operation, by increasing only the threshold voltage of the predetermined programmable elements. Accordingly, the predetermined logic circuitries in the semiconductor device can be connected or disconnected to/from one another as appropriate, and thus the semiconductor device can be caused to provide a predetermined function.

Note that the gate insulating film 105 serving as a charge-trapping film in the programmable element according to this embodiment is configured to have more than a certain atomic concentration of Hf contained therein. The atomic concentration should be 30 percent or more of the total atomic concentration of Hf and Si such that more charges can be trapped in the gate insulating film 105, and that thereby the threshold voltage of the channel region can be greatly changed.

Figure 3:
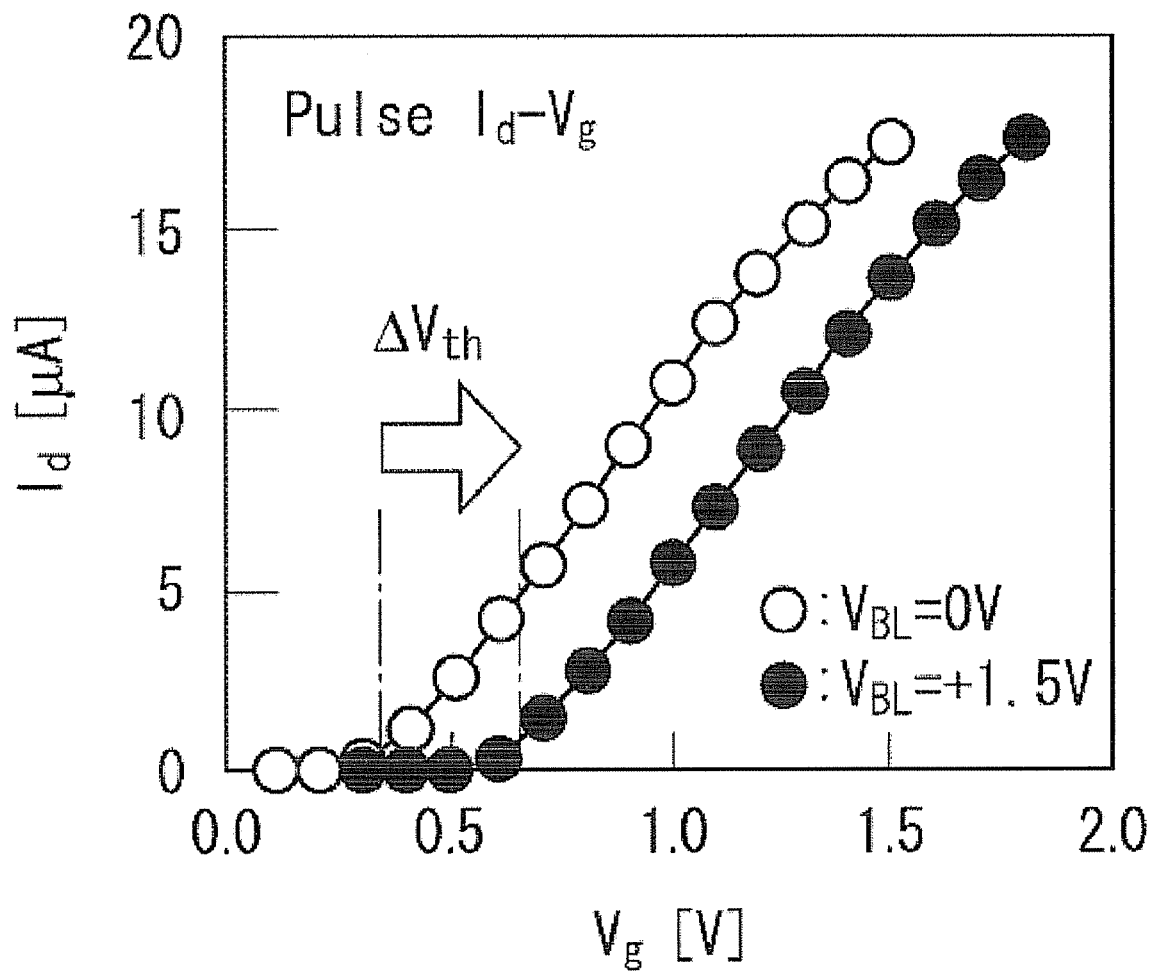
FIG. 3 is a graph showing amounts of threshold voltage change caused by a program voltage application on the basis of a simulation using the programmable element according to the embodiment of the present invention.

Here, with reference to FIG. 3, description will be given of characteristics of the n-type programmable element according to this embodiment. FIG. 3 shows amounts of threshold voltage change before and after application of a program voltage on the basis of a simulation using the programmable element according to this embodiment. In FIGS. 3 and 4, Vth denotes a threshold voltage, VBL denotes a program voltage, Vg denotes a gate voltage, and Id denotes a drain current.

As shown in FIG. 3, when a program voltage of 1.5 V is applied to the gate electrode 106 of the n-type programmable element according to this embodiment, the threshold voltage of the n-type programmable element increases by approximately 0.5 V, compared to a voltage in a case of no program voltage applied. As described above, if the threshold voltage of some of the programmable elements formed on the interconnections 109 between the logic circuitries are increased, these programmable elements can be switched off.

As a conventional semiconductor device, there is a programmable logic device, such as an FPGA, including EPROMs or EEPROMs as programmable elements. Programmable elements of such semiconductor devices require a program voltage with a large absolute value, such as a high voltage approximately 10 V or more. Accordingly, such a semiconductor device has a problem that other various logic circuit elements and the like disposed together with such programmable elements on the semiconductor substrate must be designed and processed such that the they can withstand a high voltage.

By contrast, the n-type programmable element of a semiconductor device according to this embodiment requires an extremely low program voltage with an absolute value of approximately 3 V or less to be applied thereto, in order to be programmed. This eliminates the need for the special designing and processing for causing the logic circuit elements and the like to have enhanced withstand voltages.

Moreover, the n-type programmable element according to this embodiment allows a program that has been written therein to be easily rewritten. More specifically, when the zero voltage is applied to the gate electrode 106 of each n-type programmable element in which a charge is trapped in the gate insulating film 105, the charge having been trapped in the gate insulating film 105 escapes to the channel region. This lowers the threshold voltage in the channel region, and, as a result, the program having been written in the n-type programmable element can be erased. Furthermore, when the program voltage is applied to the gate electrode 106 of each predetermined n-type programmable element again, the threshold voltage in the channel region can be increased again, and, as a result, the program can be rewritten in the n-type programmable element.

Moreover, the n-type programmable element according to this embodiment can store and retain the program therein even after the semiconductor device thereof is powered off. This is because, in this n-type programmable element, the charge once trapped in the gate insulating film 105 serving as a charge-trapping film is less likely to escape to the channel region unless the zero voltage is applied to the gate electrode 106.

Incidentally, in a conventional semiconductor device such as an FPGA including antifuses as programmable elements, an electrical connection is established in the semiconductor device when the corresponding fuse is physically destructed. Accordingly, such a semiconductor device has a problem that a program once written in the semiconductor device cannot be rewritten. Meanwhile, in a conventional semiconductor device such as an FPGA including SRAMs as programmable elements, a memory content therein is erased once the semiconductor device is powered off. Accordingly, such a semiconductor device has a problem that the program must be rewritten in the semiconductor device every time the semiconductor device is powered on.

By contrast, the programmable element according to this embodiment has advantages: that a program can be rewritten freely by the controlling of the voltage applied to the gate electrode 106, as described above; and that a program can be stored and retained even after the semiconductor device is powered off, since the gate insulating film 105 serving as a charge-trapping film can retain the charge trapped therein.

As described above, the programmable element according to this embodiment and the semiconductor device including this programmable element each requires a lower program voltage, allows a program therein to be rewritten, and can store and retain the program therein even after the semiconductor device is powered off. Accordingly, they are successfully improved in program characteristics over conventional programmable elements and semiconductor devices including the conventional programmable elements.

The characteristics of the n-type programmable element according to this embodiment, especially the characteristics of the threshold voltage change during the program voltage application, depend on either a thickness $T_{HfSiON}$ of the gate insulating film 105 as a charge-trapping film containing Hf, or a thickness TIL of the interlayer 104, shown in FIG. 1. Hereinbelow, description will be given of simulation results showing threshold voltage change dVth with the change of the thickness $T_{HfSiON}$ of the gate insulating film 105 or the thickness TIL of the interlayer 104 in the programmable element.

Figure 4A:
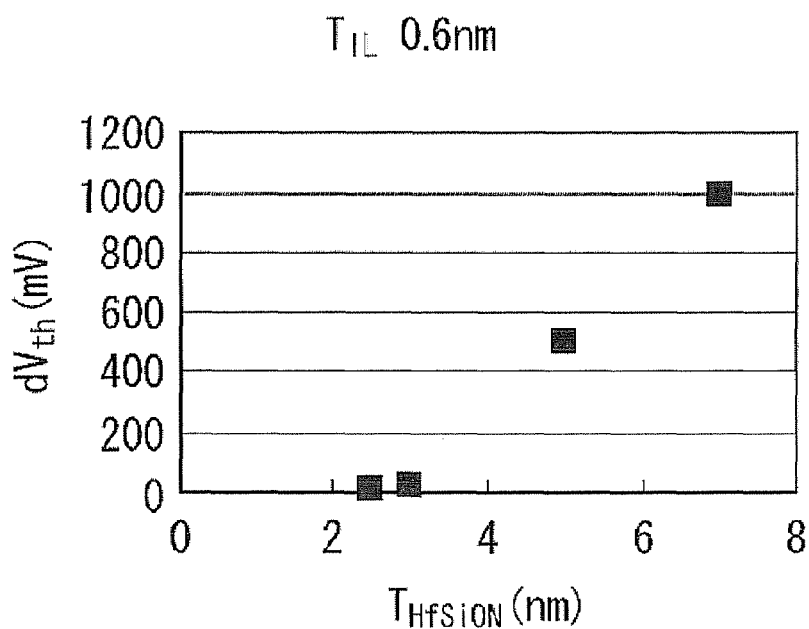
FIGS. 4A and 4B are graphs based on a simulation using the programmable element according to the embodiment of the present invention.

FIG. 4A shows the threshold voltage change dVth with the change of the thickness $T_{HfSiON}$ of the gate insulating film 105 while a program voltage of 1.5 V is applied to the programmable element. Note that the programmable element is designed such that the interlayer 104 has a thickness TIL of 0.6 nm.

As is clear from FIG. 4A, the threshold voltage of the programmable element is greatly changed when the thickness $T_{HfSiON}$ of the gate insulating film 105 is approximately 4 nm or more, since an effectively increased amount of charge is trapped in the film.

Figure 4B:
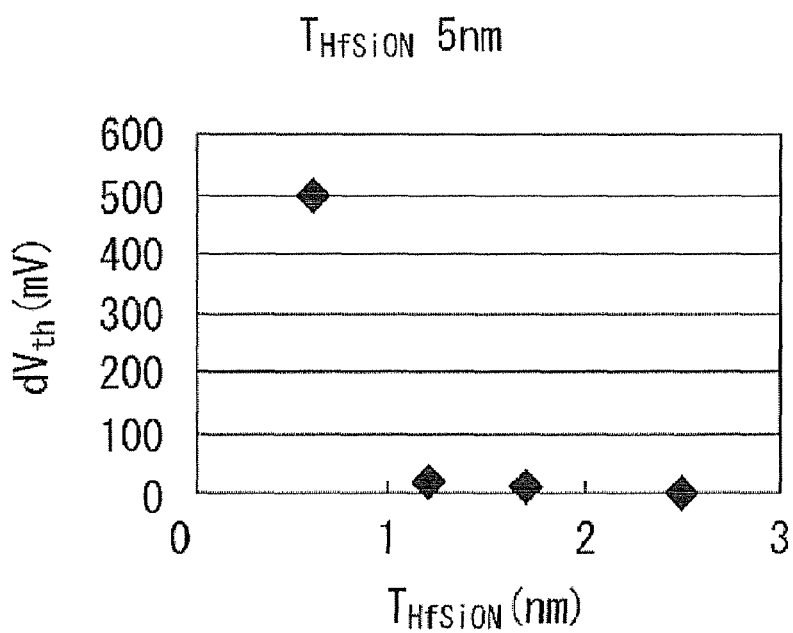

On the other hand, FIG. 4B shows the threshold voltage change dVth with the change of the thickness TIL of the interlayer 104 while a program voltage of 1.5 V is applied to the programmable element. Note that the programmable element is designed such that the gate insulating film 105 has a thickness T HfSiON of 5 nm.

As is clear from FIG. 4B, the threshold voltage of the programmable element is greatly changed when the thickness TIL of the interlayer 104 is approximately 1 nm or less, since an effectively increased amount of charge is trapped in the gate insulating film 105.

As is clear from these simulation results, when the programmable element according to this embodiment is designed such that the thickness $T_{HfSiON}$ of the gate insulating film 105 serving as a charge-trapping film is approximately 4 nm or more, and that the thickness TIL of the interlayer 104 is approximately 1 nm or less, the effectively increased amount of charge is trapped in the gate insulating film 105, and thus the threshold voltage of the programmable element can be greatly changed. Accordingly, the programmable element can be programmed more easily.

Next, with reference to FIGS. 5A to 6C, description will be given of a manufacturing method of the semiconductor device including the aforementioned programmable elements. FIGS. 5A to 6C are process cross-sectional views for illustrating a manufacturing method of the semiconductor device including the programmable elements. In each of FIGS. 5A to 6C, the main parts of the programmable element formation region 100a and a logic circuit element formation region 100b are extracted and shown on the right and left, respectively, viewed from the observer.

Figure 5A:
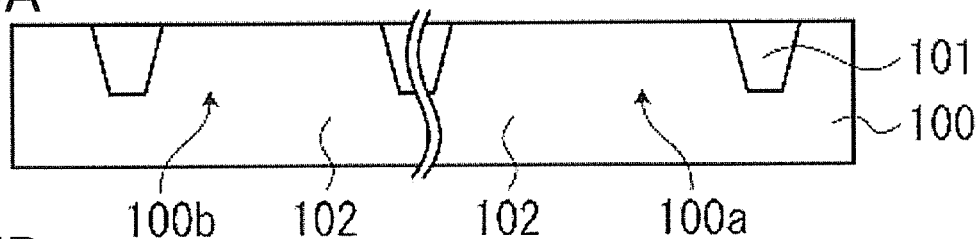
FIGS. 5A to 5G are process cross-sectional views for illustrating a manufacturing method of the semiconductor device including the programmable elements according to the embodiment of the present invention.

Firstly, as shown in FIG. 5A, in the upper surface of a silicon substrate to serve as the semiconductor substrate 100, the element isolations 101, such as shallow trench isolations (STIs), are formed. Thereby, the programmable element formation regions 100a and the logic circuit element formation regions 100b which are individually defined by the element isolations 101 are formed in the upper surface of semiconductor substrate 100.

Specifically, a silicone oxide film and a silicon nitride film are firstly formed on the semiconductor substrate 100. Thereafter, the portions, to be formed into the programmable element formation regions 100a and the logic circuit element formation regions 10b, of the upper surface of the semiconductor substrate 100 are masked with a resist film, and then the silicone oxide film, the silicon nitride film and even the semiconductor substrate 100 are selectively etched off by reactive ion etching (RIE) with this mask. Thereby, trenches are formed in the upper surface of the semiconductor substrate 100.

Then, after the resist film is incinerated, silicone oxide films are formed, by use of a CVD method, on the inner surfaces of the trenches formed in the upper surface of the semiconductor substrate 100, as well as on the portions, on which the films including the silicon nitride film are formed, of the semiconductor substrate 100. Thereafter, the silicone oxide films and the silicon nitride film outside the trenches are ground off by chemical mechanical polishing (CMP), so that the semiconductor substrate 100 outside the trenches is exposed. Thereby, the element isolations 101 are formed in the upper surface of the semiconductor substrate 100, and, consequently, the programmable element formation regions 10a and the logic circuit element formation regions 100b are individually defined by the element isolations 101.

Subsequently, a sacrificial oxide film with a thickness of approximately 10 nm, such as a silicone oxide film, is formed on the semiconductor substrate 100 by the CVD method or a thermal oxidation method. Thereafter, p-type impurity ions, such as boron or indium ions, are implanted into the programmable element formation regions 100a and the logic circuit element formation regions 100b, and these regions 100a and 100b are heat-treated. Thereby, the well regions 102 with adjusted threshold voltages are formed. Then, the sacrificial oxide film is peeled off with dilute hydrofluoric acid.

Figure 5B:
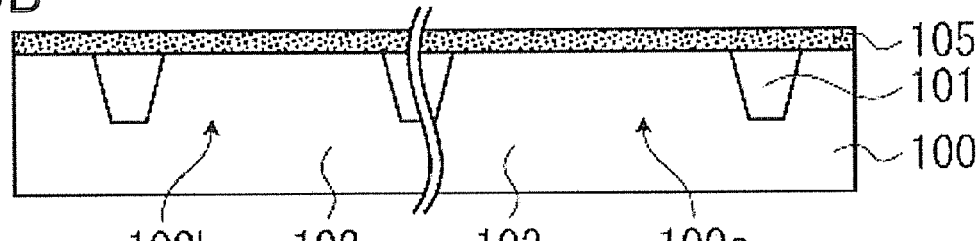

Next, as shown in FIG. 5B, an HfSiON film with a thickness of approximately 3 nm to serve as the gate insulating film 105 is formed on the entire upper surface of the semiconductor substrate 100 by use of a metal organic chemical vapor deposition (MOCVD) method and a plasma nitridation method.

Figure 5C:
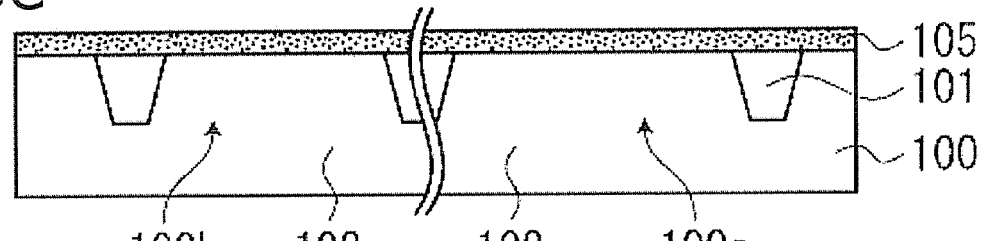

Then, as shown in FIG. 5C, portions, on the programmable element formation regions 100a, of the HfSiON film are masked with resist films by a photolithography method. Thereafter, only the other portions, on the logic circuit element formation regions 100b, of the HfSiON film are removed by wet etching.

Figure 5D:
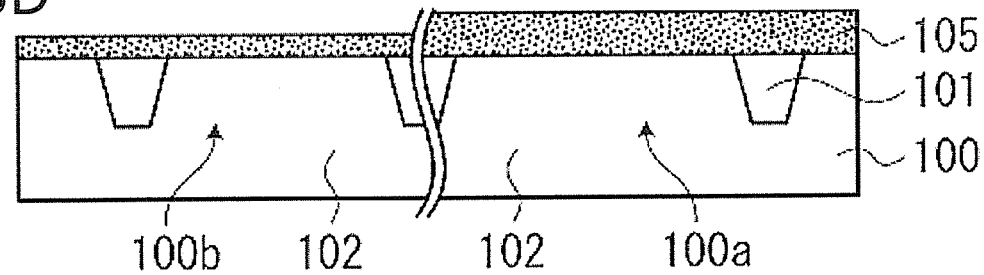

Then, as shown in FIG. 5D, after the resist films on the programmable element formation regions 100a are peeled off, another HfSiON film with a thickness of approximately 2.5 nm to serve as the gate insulating film 105 is formed on each of the logic circuit element formation regions 100b and the remaining portions of the HfSiON film in the programmable element formation regions 100a, by an MOCVD method and a plasma nitridation method.

Here, the HfSiON films formed on the programmable element formation regions 100a are to be formed into the gate insulating films 105 to serve as charge-trapping films in the programmable elements. Accordingly, the atomic concentration of Hf contained in each of these HfSiON films is set to a predetermined value or more, for example, 30 percent of the total atomic concentration of Hf and Si contained in the HfSiON film so that the threshold voltage of the programmable element thereof can be effectively changed when a program voltage is applied thereto.

Thereafter, the semiconductor device is annealed in an atmosphere containing a trace of oxygen (oxidized at reduced oxygen partial pressure) while the HfSiON films are annealed at the same time. Through this reduced pressure oxidation, the interlayer 104 (not shown), which is a film such as a silicone oxide film, is formed on each of the interfaces between the HfSiON films and the silicon substrate in the programmable element formation regions 100a. Note that, in this process, the oxygen partial pressure and the temperature are set such that the thickness of the interlayer 104 can be approximately 1 nm or less. This setting allows the thin HfSiON films formed on the respective logic circuit element formation regions 100b of the semiconductor substrate 100 to be oxidized so that the thickness of the interlayer 104 in each of the regions 100b can be 1 nm or less, and good interface characteristics can be obtained.

Figure 5E:
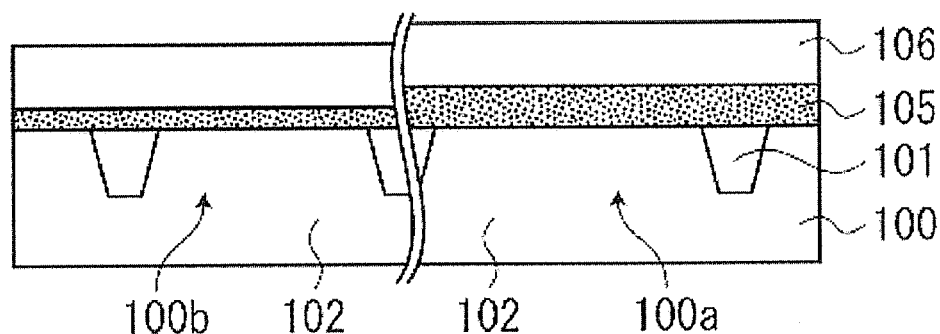

Next, as shown in FIG. 5E, a conductive material film to be formed into the gate electrodes 106 is formed on the HfSiON films. For example, conductive impurity ions such as phosphorus are added to silane on its thermal decomposition in nitrogen by a thermal CVD method, and thereby a doped polysilicon film is formed on the HfSiON films. Alternatively, as a film to be formed into the gate electrodes 106, a metal film made of nickel, tungsten or the like may be formed by sputtering or the like.

Figure 5F:
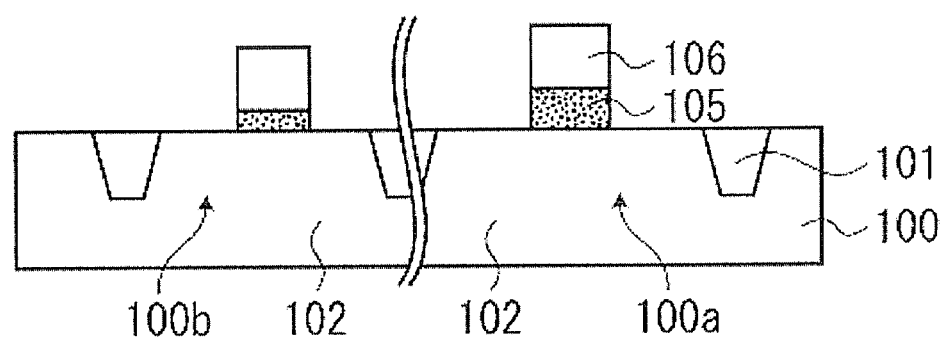

Then, as shown in FIG. 5F, the gate electrodes 106 and the gate insulating films 105 are selectively etched by a photolithography method and RIE, and thereby a stacking structure consisting of the gate insulating film 105 and the gate electrode 106 is caused to remain on each of the programmable element formation regions 100a and the logic circuit element formation regions 100b.

Figure 5G:
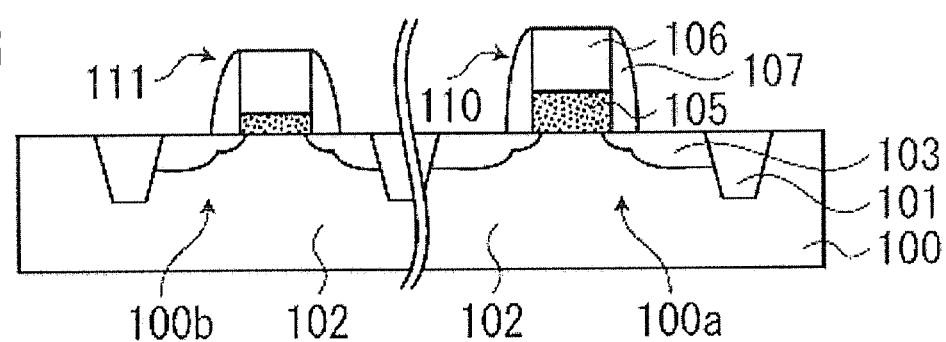

Next, as shown in FIG. 5G, n-type impurity ions such as arsenic ions are implanted into portions, adjacent to the sides of the stacking structures each consisting of the gate insulating film 105 and the gate electrode 106, of the programmable element formation regions 100a and the logic circuit element formation regions 100b. Here, the ion implantation is performed such that the n-type impurity ions concentration of the portions can be approximately 1×1015 cm-3. Thereafter, the portions are annealed at 900° C./5 s by rapid thermal annealing (RTA), and thereby, shallow source/drain layers 103 to serve as extension layers are formed in these respective portions.

Subsequently, films such as silicon nitride films, silicone oxide films or the like are formed on the semiconductor substrate 100 and the gate electrodes 106, respectively. Thereafter, the films are etched back and thus the gate-sidewall insulating films 107 are formed on the sides of the stacking structures each consisting of the gate insulating film 105 and the gate electrode 106.

Thereafter, n-type impurity ions such as phosphorus ions are implanted into portions, adjacent to the sides of the gate-sidewall insulating films 107, of the programmable element formation regions 100a and the logic circuit element formation regions 10b. Here, the ion implantation is performed such that the n-type impurity ions concentration of the portions can be approximately 5×1015 cm-3. Thereafter, the portions are activated by spike annealing, and thereby, the deep source/drain layers 103 are formed in these respective portions.

In this way, the n-type programmable elements 110 are formed on the respective programmable element formation regions 100a, while logic circuit elements 111, which are n-MOSFETs, are formed on the respective logic circuit element formation region 100b.

Figure 6A:
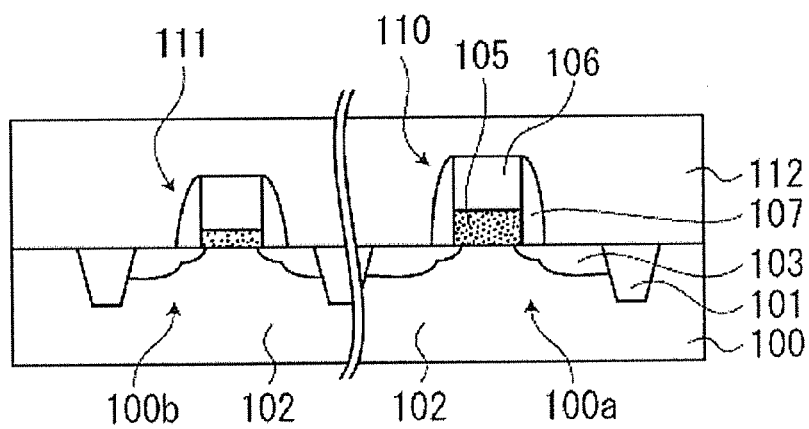
FIGS. 6A to 6C are process cross-sectional views for illustrating the manufacturing method of the semiconductor device including the programmable elements according to the embodiment of the present invention.

Next, as shown in FIG. 6A, a binary compound film (not shown) consisting of nickel silicide or cobalt silicide is formed on each of the upper surfaces of the gate electrodes 106 and the surfaces of the source/drain layers 103, with ordinary salicide processes. Specifically, for example, a film consisting of a refractory metal such as nickel (Ni), cobalt (Co), titanium (Ti), iridium (Ir) or platinum (Pt) is formed on each of the gate electrodes 106 and the source/drain layers 103. Thereafter, the semiconductor device is heat-treated to cause the refractory metal to react with the gate electrodes 106 and the source/drain layers 103, and, as a result, the aforementioned binary compound film is formed.

Thereafter, an interlayer insulating layer 112 made of a film such as a silicone oxide film is formed on the semiconductor substrate 100 by a CVD method or the like.

Figure 6B:
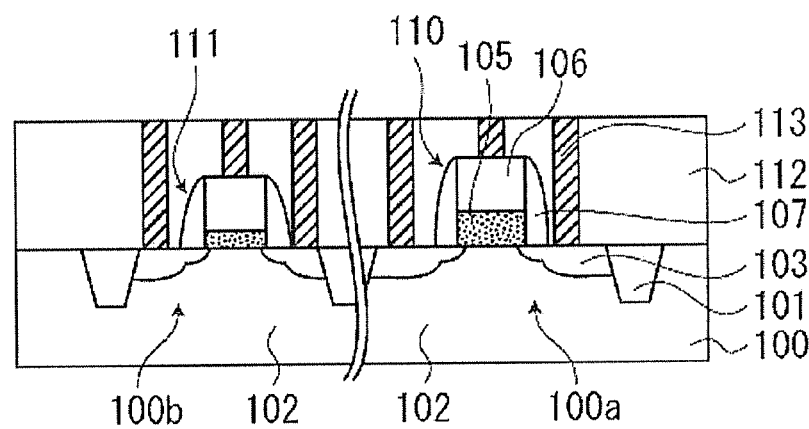

Then, as shown in FIG. 6B, a resist film or the like is formed on the interlayer insulating layer 112 on the semiconductor substrate 100, and openings are formed in the resist film by a photolithography method. Thereafter, portions, respectively corresponding to the bottoms of the openings, of the interlayer insulating layer 112 are etched off by RIE, and thus contact holes are formed such that the gate electrode 106 and the source/drain layers 103 of each of the programmable elements 110 on the programmable element formation regions 100a and the logic circuit elements 111 on the logic circuit element formation regions 100b can be exposed.

Thereafter, by a method such as plating or sputtering, the contact holes are filled with a metal such as copper or aluminum, and simultaneously a film consisting of the metal is formed on the interlayer insulating layer 112. The metal film outside the contact holes is ground off by CMP, and thus the contact plugs 113 to be respectively connected to the gate electrodes 106 and the source/drain layers 103 are formed. Note that barrier films, such as TiN films, may be formed on the inner walls of the contact holes before the contact plugs 113 are formed, to prevent the metal for the contact plugs 113 from overflowing onto the interlayer insulating layer 112.

Figure 6C:
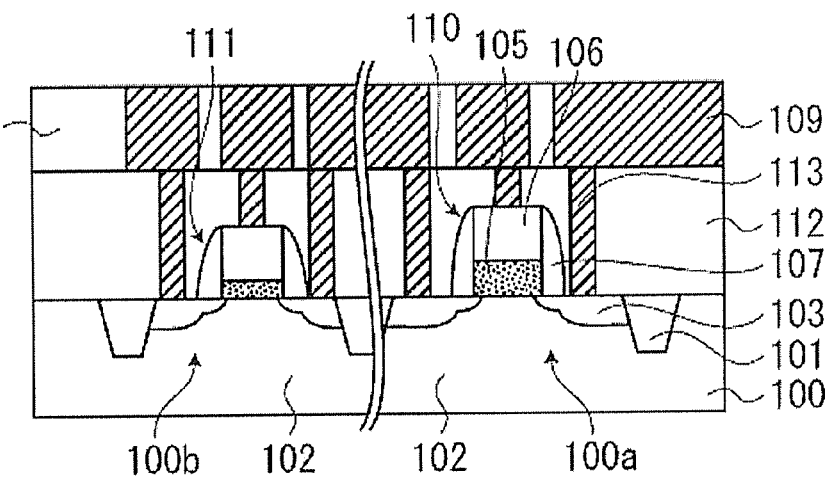

Next, as shown in FIG. 6C, an upper interlayer insulating layer 112 made of a film such as a silicone oxide film is further formed on the interlayer insulating layer 112. Then, a resist film is formed on the upper interlayer insulating layer 112, and an interconnection pattern is formed in the resist film by a photolithography method. Thereafter, the upper interlayer insulating layer 112 are selectively etched off by RIE by use of, as a mask, the interconnection pattern formed in the resist film, and thus interconnection trenches are formed on the contact plugs 113.

Thereafter, the interconnection trenches are filled with a metal such as copper or aluminum, and simultaneously a film consisting of the metal is formed on the upper interlayer insulating layer 112. Then, the metal film outside the interconnection trenches is ground off by CMP, and thus the interconnections 109 are formed. Some of the interconnections 109 are electrically connected to the gate electrodes 106 of the programmable elements 110 and the logic circuit elements 111 through the contact plugs 113, respectively, and used for applying a program voltage or a gate voltage to the corresponding element. Meanwhile, others of the interconnections 109 are electrically connected to the source/drain layers 103 of the programmable elements 110 and the logic circuit elements 111 through the contact plugs 113, respectively. In this process, the predetermined programmable elements 110 and logic circuit elements 111 are electrically connected to one another via the interconnections 109. Note that barrier films, such as TiN films, may be formed on the inner walls of the interconnection trenches in advance to prevent the metal for the interconnections 109 from overflowing onto the upper interlayer insulating layer 112. By the method as described above, the semiconductor device including the programmable elements 110, that is, a logic device programmable as required can be manufactured.

In each conventional semiconductor device in which EPROMs, EEPROMs or antifuses are employed as programmable elements, each programmable element has a different configuration from that of a MOSFET so that the logic circuit elements and the programmable elements need to be manufactured by different manufacturing methods. By contrast, according to the manufacturing method of the semiconductor device including the programmable elements according to this embodiment, each programmable element 110 has the same configuration as that of a MOSFET so that the logic circuit elements 111 and the programmable elements 100 can be manufactured by a single manufacturing process. Thus, the manufacturing method according to this embodiment can simplify the manufacturing process of semiconductor devices as compared to the conventional manufacturing methods.

Modified Embodiment

Figure 7:
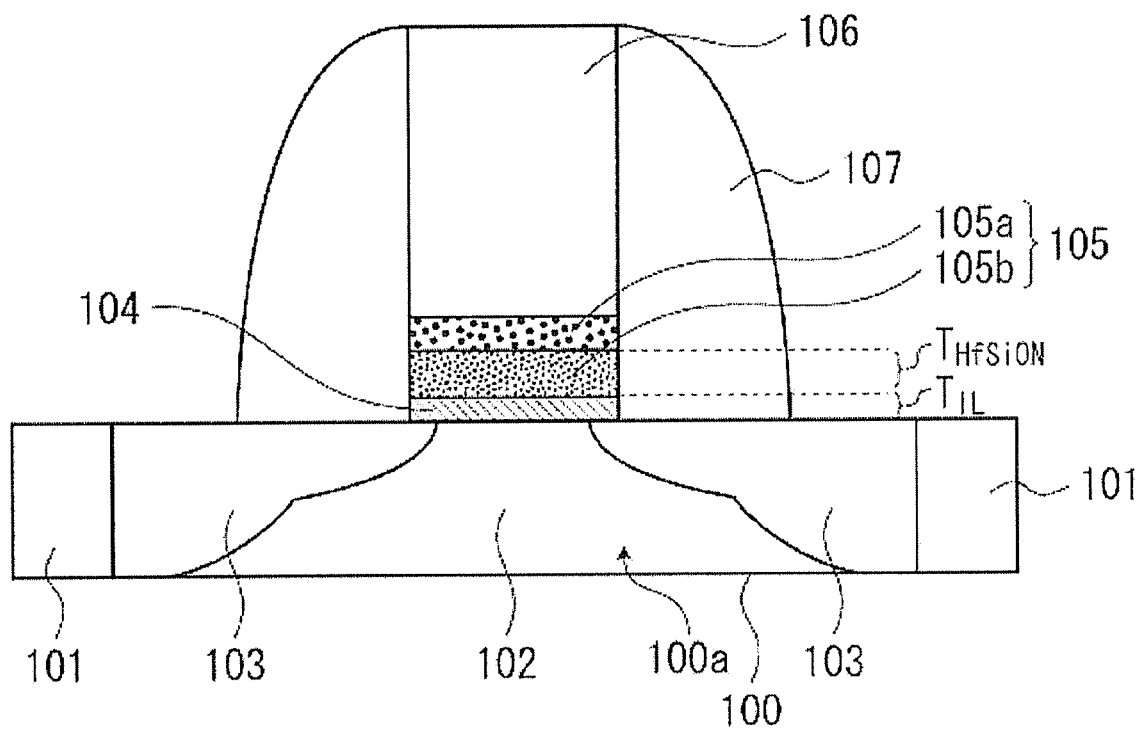
FIG. 7 is a cross-sectional view showing a configuration of a programmable element according to a modified embodiment of the present invention.

Next, with reference to FIG. 7, description will be given of a modified example of the programmable element according to the aforementioned embodiment. FIG. 7 is a cross-sectional view showing a configuration of the programmable element according to the modified embodiment of the present invention. The configuration of the gate insulating film 105 of the programmable element is the only difference between the programmable element according to this modified embodiment and the one according to the aforementioned embodiment. Accordingly, the same constituents as those of the programmable element of the aforementioned embodiment are denoted by the same reference numerals, and the description thereof will be omitted.

Unlike the aforementioned embodiment, in the programmable element according to this modified embodiment, a gate insulating film 105 consisting of two layers made of different materials is formed on the channel region between the source/drain layers 103 formed apart from each other in the upper surface of the semiconductor substrate 100. In this modified embodiment, an upper gate insulating film 105a and a lower gate insulating film 105b constituting the gate insulating film 105 are respectively formed of an HfSiO film and an HfSiON film.

As similar to the programmable element according to the aforementioned embodiment, in the programmable element according to this modified embodiment as well, when a relatively low program voltage of approximately 3 V or less is applied thereto, the voltage causes the charge in the channel region to be trapped in the gate insulating film 105. This increases the threshold voltage of the channel region, and thus the on/off condition of the programmable element can be controlled. Accordingly, the semiconductor device including this programmable element requires a lower program voltage, allows a program therein to be rewritten, and can store and retain the program therein even after the semiconductor device is powered off. Accordingly, they are successfully improved in program characteristics over conventional programmable elements and semiconductor devices including the conventional programmable elements.

Note that, in the programmable element according to this modified embodiment, not both the lower and upper gate insulating films 105b and 105a need to contain Hf, but a configuration may be employed in which only either one of the gate insulating films contains Hf. In this case, the one of the gate insulating films that contains Hf functions as a charge-trapping film while the programmable element is programmed through adjustment of the gate voltage In addition, in the programmable element of this modified embodiment, the atomic concentration of Hf contained in the entire gate insulating film 105 to serve as a charge-trapping film should preferably be set to a predetermined value or more, for example, 30 percent of the total atomic concentration of Hf and Si contained in the entire gate insulating film 105 to serve as a charge-trapping film so that the threshold voltage of the channel region thereof can be effectively changed. Moreover, the thickness TIL of the interlayer 104 formed between the semiconductor substrate 100 and the lower gate insulating film 105b should preferably be 1 nm or less, and the thickness $T_{HfSiON}$ of the one of the upper and lower gate insulating films that contains Hf should preferably be 4 nm or more.

A manufacturing method of a semiconductor device including the programmable elements according to this modified embodiment is almost the same as that of the semiconductor device including the programmable elements according to the aforementioned embodiment, but is partially different. Specifically, the steps of forming the gate insulating film are different from those in the aforementioned embodiment shown in FIGS. 5B to 5D.

More specifically, in the aforementioned embodiment, the two HfSiON films are stacked to serve as the gate insulating film 105 of the programmable element on each programmable element formation region 100a of the semiconductor substrate 100 by a CVD method or the like, as shown in FIGS. 5B to 5D. By contrast, in this modified embodiment, after an HfSiON film is stacked on each programmable element formation region 100a by a CVD method or the like, an insulating film different from an HfSiON film, such as an HfSiO film, is stacked on the HfSiON film by the CVD method or the like. Thereby, a multilayer consisting of an HfSiON film and an insulating film different from an HfSiON film is formed on each programmable element formation region 100a.

As similar to the aforementioned embodiment, according to the manufacturing method of the semiconductor device including the programmable elements according to this modified embodiment as well, the logic circuit elements 111 and the programmable elements 100 can be manufactured by a single manufacturing process. Thus, the manufacturing method according to this modified embodiment can also simplify the manufacturing process of semiconductor devices as compared to the conventional manufacturing methods.

Moreover, in this modified embodiment, as the gate insulating films 105 of the logic circuit elements 111, for gate insulating films 105 containing no Hf, for example, silicone oxide films can be employed. Accordingly, the logic circuit elements 111 can be designed to have any desired function.

Note that the present invention is not restricted by the aforementioned embodiment and modified embodiment, but can be implemented as various modified forms without departing from the gist of the present invention. For example, although each of the programmable elements according to the aforementioned embodiment and modified embodiment has an n-MOSFET structure, each programmable element may have a p-MOSFET structure.

The p-type programmable elements can be programmed as follows. Specifically, a program voltage is applied to each of desired ones of the p-type programmable elements, and thus a threshold voltage of the channel region thereof is reduced. Accordingly, these desired P-type programmable elements are set to be switched on and thereby desired ones of the logic circuitries are connected to one another, if no drain voltage is applied to the P-type programmable elements.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A programmable element, comprising:
a semiconductor substrate;
source/drain layers formed apart from each other in an upper surface of the semiconductor substrate;
a gate insulating film including a charge-trapping film containing Hf and formed on a portion between the source/drain layers of the semiconductor substrate; and
a gate electrode formed on the gate insulating film with a program voltage applied to the gate electrode,
wherein the charge-trapping film contains Si, and an atomic concentration of Hf contained in the charge-trapping film is 30 percent or more of a total atomic concentration of Hf and Si contained in the charge-trapping film.

2. The programmable element according to claim 1, wherein the interlayer is $SiO_2$.

3. The programmable element according to claim 1, wherein a thickness of the charge-trapping film is 4 nm or more.

4. The programmable element according to claim 1, wherein a voltage of 3 V or less is applied to the gate electrode as the program voltage and thereby the programmable element is controlled.

5. The programmable element according to claim 1, wherein the charge-trapping film is HfSiON and an upper gate insulating film is provided on the charge-trapping film.

6. The programmable element according to claim 5, wherein the upper gate insulating film is HfSiO.

7. The programmable element according to claim 6, wherein an atomic concentration in the charge-trapping film the upper gate insulating layer is 30 percent or more of a total atomic concentration of Hf and Si contained in the charge-trapping film and the upper gate insulating layer.

8. A programmable element, comprising:
a semiconductor substrate;
source/drain layers formed apart from each other in an upper surface of the semiconductor substrate;
a gate insulating film including a charge-trapping film containing Hf and formed on a portion between the source/drain layers of the semiconductor substrate;
a gate electrode formed on the gate insulating film with a program voltage applied to the gate electrode; and
an interlayer interposed between the semiconductor substrate and the gate insulating film, wherein a thickness of the interlayer is 1 nm or less.

9. The programmable element according to claim 8, wherein the charge-trapping film contains Si, and an atomic concentration of Hf contained in the charge-trapping film is 30 percent or more of a total atomic concentration of Hf and Si contained in the charge-trapping film.

10. The programmable element according to claim 8, wherein a thickness of the charge-trapping film is 4 nm or more.

11. The programmable element according to claim 8, wherein a voltage of 3 V or less is applied to the gate electrode as the program voltage and thereby the programmable element is controlled.

12. The programmable element according to claim 8, wherein the charge-trapping film is HfSiON and an upper gate insulating film is provided on the charge-trapping film.

13. The programmable element according to claim 8, wherein an atomic concentration in the charge-trapping film the upper gate insulating layer is 30 percent or more of a total atomic concentration of Hf and Si contained in the charge-trapping film and the upper gate insulating layer.

14. A programmable element, comprising:
 a semiconductor substrate;
 source/drain layers formed apart from each other in an upper surface of the semiconductor substrate;
 a gate insulating film including a charge-trapping film containing Hf and formed on a portion between the source/drain layers of the semiconductor substrate; and
 a gate electrode formed on the gate insulating film with a program voltage applied to the gate electrode,
 wherein the charge-trapping film is HfSiON and an upper gate insulating layer is HfSiO and provided on the charge-trapping film, and an atomic concentration in the charge-trapping film, the upper gate insulating layer is 30 percent or more of a total atomic concentration of Hf and Si contained in the charge-trapping film and the upper gate insulating layer.

15. The programmable element according to claim 14, wherein a thickness of the charge-trapping film is 4 nm or more.

16. The programmable element according to claim 14, wherein a voltage of 3 V or less is applied to the gate electrode as the program voltage and thereby the programmable element is controlled.

* * * * *